United States Patent
Yen et al.

(10) Patent No.: US 6,423,646 B1
(45) Date of Patent: Jul. 23, 2002

(54) METHOD FOR REMOVING ETCH-INDUCED POLYMER FILM AND DAMAGED SILICON LAYER FROM A SILICON SURFACE

(75) Inventors: Tzu-Shih Yen; Hsiu-Lan Lee, both of Hsinchu; Pei-Wen Li, Kao-Hsiung, all of (TW)

(73) Assignee: Vanguard International Semiconductor Corporation, Hsin Chu (TW)

( * ) Notice: Subject to any disclaimer, the term of this patent is extended or adjusted under 35 U.S.C. 154(b) by 0 days.

(21) Appl. No.: 09/090,627

(22) Filed: Jun. 4, 1998

(51) Int. Cl.$^7$ ........................ H01L 21/302; C11D 77/04
(52) U.S. Cl. ........................ 438/753; 510/176
(58) Field of Search ................ 510/175, 176; 134/1.3; 438/745, 753

(56) References Cited

U.S. PATENT DOCUMENTS

| | | | | |
|---|---|---|---|---|
| 4,941,941 A | * | 7/1990 | Austin et al. ............... | 438/753 |
| 5,507,978 A | * | 4/1996 | Honda ......................... | 252/544 |
| 5,631,314 A | * | 5/1997 | Wakiya et al. .............. | 524/165 |
| 5,672,577 A | * | 9/1997 | Lee ............................. | 510/175 |
| 5,693,737 A | * | 12/1997 | Reiff et al. .................. | 528/45 |
| 5,746,233 A | * | 5/1998 | Kuroda et al. ............. | 134/57 R |
| 5,888,309 A | * | 3/1999 | Yu ............................... | 134/1.2 |
| 6,090,304 A | * | 7/2000 | Zhu et al. .................... | 216/79 |
| 6,221,818 B1 | * | 4/2001 | Lee ............................. | 510/176 |

\* cited by examiner

Primary Examiner—Wael Fahmy, Jr.
Assistant Examiner—Brook Kebede
(74) Attorney, Agent, or Firm—Randy W. Tung

(57) ABSTRACT

The present invention discloses a method for simultaneously removing from a silicon surface polymeric films and damaged silicon layers by exposing the surface to a cleaning solution that contains amine or ethanolamine for a length of time that is sufficient to remove all such unwanted materials. The method is effective in cleaning away damaged silicon layers having a thickness between about 20 Å and about 60 Å in a period of time between about 2 minutes and about 20 minutes. In a preferred embodiment, the cleaning solution is a water solution of ethanolamine and gallic acid.

11 Claims, 1 Drawing Sheet

METHOD FOR REMOVING ETCH-INDUCED POLYMER FILM AND DAMAGED SILICON LAYER FROM A SILICON SURFACE

FIELD OF THE INVENTION

The present invention generally relates to a method for removing unwanted materials from a silicon surface and an article prepared by such method and more particularly, relates to a method for removing simultaneously from a silicon surface etch-induced polymeric films and damaged silicon layers by exposing the surface to an amine-containing solution and an article prepared by the method.

BACKGROUND OF THE INVENTION

Modern semiconductor devices are built on semi-conducting substrates such as silicon substrates that have $P^+$ and $N^+$ type doped regions in the substrates as basic elements of the device. The doped regions must be connected in a specific configuration to form a desired circuit. The circuit needs to be accessible to the outside world through conducting pads for testing and through bonding into a packaged chip. To form a semiconductor circuit, at least one layer of a conducting material such as metal must be deposited and patterned to form contacts and interconnects between the different regions of the chip. For instance, in a typical semiconductor fabrication process, a silicon wafer is first covered with an insulating layer and then, patterned and etched for contact openings in the insulating layer. A conductive material is then deposited and defined to form contact plugs and interconnecting leads.

Contact windows (or holes) to a silicon or silicide layer are usually defined and etched in an insulating layer, i.e., a dielectric material layer, by using lithographic and dry etching techniques. A dry etching technique works anisotropicallly to enable the opening of contact holes that have high aspect ratios. Once formed, contact holes can be filled with a conducting material such as a metal to form vertical connections to a first level metal. Contact holes can also be made by a wet etch process. A wet etch process is carried out by immersing a wafer in an appropriate etchant solution or by spraying the wafer with a solution. When a wet etch process is used, the etching action is isotropic in nature such that the material is etched in both the lateral and the vertical directions. Lateral etching in a wet etch process produces undercutting under a mask which is undesirable in most fabrication processes.

On the other hand, a dry etch process etches anisotropically and creates vertical sidewalls in a contact hole such that the top and the bottom of the hole have almost the same dimensions. The dry etch process is therefore more frequently used in modern sub-micron devices since it does not create undercutting problem and does not require or waste additional lateral area for a contact hole. The dry etching process further provides the benefits of reduced chemical hazard and waste treatment problems, easily achievable process automation and tool clustering. Two of the most widely used dry etching techniques are the plasma etching technique and the reactive ion etching technique.

While dry etching technique provides significant improvement in dimensional control and therefore is widely used in VLSI and ULSI fabrication technologies, it also has some limitations. One of such limitations is the formation of polymeric contaminating films which contains carbon and fluorine. The polymeric contaminating films are generally formed from a fluorocarbon gas plasma reaction as a reaction byproduct. The polymeric contaminating films are detrimental to an IC device formed on the surface of a silicon wafer and moreover, are very difficult to remove. The presence of these type of organic impurities on the wafer surface can further cause incomplete cleaning of the surface, leaving contaminants such as native oxide or metal impurities which can cause the device to fail.

Another limitation of the dry etching technique is the inevitable damage to the surface layer of the silicon substrate that is exposed in the contact hole. For instance, when a contact hole is formed on the surface of a silicon substrate, the dry etching plasma gas etches away an insulating layer such as oxide situated on top of the silicon. However, the etching reaction does not completely stop at the oxide silicon interface. This is illustrated in FIG. 1.

FIG. 1 illustrates an enlarged, cross-sectional view of a silicon substrate having a contact hole formed therein. Silicon substrate 10 of the semiconductor structure 20 is first covered with an insulating layer of silicon dioxide 12. A photoresist layer 14 is then deposited on top of the oxide layer 12 and patterned for a specific circuit, i.e., in the present case, for a contact hole (or window) 16. During a dry etching process for making the contact hole 16 by removing the oxide layer in the opening, it is inevitable that the surface layer 22 of the silicon substrate is also damaged by the etching plasma gas 24. When a fluorocarbon gas plasma is used as the dry etching gas, it has been shown that a surface layer of silicon having a thickness between about 20 Å and about 60 Å is usually damaged. The single crystalline structure of the surface silicon layer is transformed to an amorphous structure by the bombardment of the gas plasma 24. A direct effect of the damaged silicon layer 22 is that the contact resistance at the damaged silicon site is drastically increased. The contact resistance has been observed to have increased to 20 k$\Omega$, while a contact resistance of less than 10 k$\Omega$ is desirable for the application of a metal contact. The damaged silicon layer not only exhibits a high contact resistance, but also exhibits an unstable resistance value which renders the fabrication of a reliable device impossible. The removal of the etch-induced damaged silicon layer from the substrate surface is therefore highly desirable.

It has been determined that the deposition of an undesirable polymeric film on a wafer surface cannot be effectively eliminated by varying the processing parameters during a dry etching process. Since the formation of the polymeric contaminating films cannot be avoided, i.e., as long as a fluorocarbon gas plasma is utilized, an effective method for cleaning the wafer surface of such contaminating films must be provided.

Conventionally, in order to clean a wafer surface of a polymeric contaminating film and a damaged silicon layer, a combination of the dry ashing technique and the wet chemical stripping technique must be utilized. For instance, a dry ashing and wet stripping processes must be used to remove etch-induced polymeric contaminating films while a dry etching technique must be used to remove the damaged silicon layers, respectively. The special post-etch treatments must be carried out for each wafer after a dry etching process in order to eliminate the cause of high contact resistance for the contact hole and the potential contamination of the semiconductor device.

The conventional dry etching and wet stripping processes have been used in ULSI small contact hole etching processes. The dry post-etch treatment is usually a high pressure (approximately 1 Torr) downstream etching process. The process is difficult to carry out since reactive species cannot effectively diffuse through a high aspect ratio contact hole in order to remove the etch-induced damaged silicon layer at the bottom of the hole. Moreover, additional steps of dry ashing and wet chemical stripping are necessary to remove the polymeric contaminating films. The conventional process therefore requires a multiple and complex post-etching cleaning process. The dry ashing method utilized is normally a downstream oxygen dry ashing method. The wet chemical stripping method utilized is usually a $H_2SO_4/H_2O_2$ (at a ratio of 3:1 or 4:1 and 120~130° C.) process. A dry ashing process by ozone has also been utilized in combination with a subsequent wet cleaning by $H_2SO_4/H_2O_2$. The wet stripping process is difficult to control since the high cleaning temperature depletes the concentration of $H_2O_2$ and renders the maintenance of a consistent solution mix difficult.

It is therefore an object of the present invention to provide a method for removing simultaneously from a silicon surface polymeric films and damaged silicon layers that does not have the drawbacks and shortcomings of the conventional methods.

It is another object of the present invention to provide a method for removing simultaneously from a silicon surface polymeric films and damaged silicon layers in a one-step cleaning process.

It is a further object of the present invention to provide a method for removing simultaneously from a silicon surface polymeric films and damaged silicon layers by exposing the surface to an amine-containing cleaning solution.

It is still another object of the present invention to provide a method for removing simultaneously from a silicon surface unwanted materials by exposing the surface to a cleaning solution containing ethanolamine.

It is yet another object of the present invention to provide a method for removing unwanted materials from a silicon surface by exposing the surface to an amine-containing cleaning solution for a length of time sufficient to remove all the unwanted materials.

It is another further object of the present invention to provide a method for removing simultaneously from a silicon surface polymeric films and damaged silicon layers that does not require multiple cleaning steps of dry ashing and wet chemical stripping.

It is still another further object of the present invention to provide a silicon wafer that is processed by a dry etching process which is substantially without polymeric contaminating films and damaged silicon layers on its surface by exposing the surface to an amine-containing cleaning solution and then rinsing such surface.

SUMMARY OF THE INVENTION

In accordance with the present invention, a method for removing simultaneously from a silicon surface polymeric films and damaged silicon layers can be carried out by exposing the surface to an amine-containing cleaning solution for a length of time sufficient to remove all such unwanted materials.

In a preferred embodiment, a method for removing simultaneously from a silicon surface polymeric films and damaged silicon layers can be carried out by the steps of first providing a first silicon surface which has polymeric films deposited and damaged silicon layers formed thereon, then exposing the silicon surface to an amine-containing cleaning solution for a length of time sufficient to remove the polymeric films and the damaged silicon layers, and then rinsing the silicon surface to substantially remove all the cleaning solution.

The present invention is also directed to a method for removing unwanted etch-induced material from the surface of a wafer which can be carried out by the steps of first providing a wafer that has at least one unwanted material on top, then providing an etch tank containing an etch solution comprises ethanolamine, exposing the surface of the wafer to the etch solution for a length of time sufficient to remove the at least one unwanted material from the surface, and then removing substantially all the etch solution from the surface of the wafer.

The present invention is further directed to a silicon wafer which is processed by a dry etching process and is substantially without polymeric contaminating films and damaged silicon layers on its surface obtained by first exposing the wafer to an amine-containing solution for a length of time sufficient to remove the polymeric contaminating films and the damaged silicon layers, and then rinsing the surface to substantially remove all the amine-containing solution.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
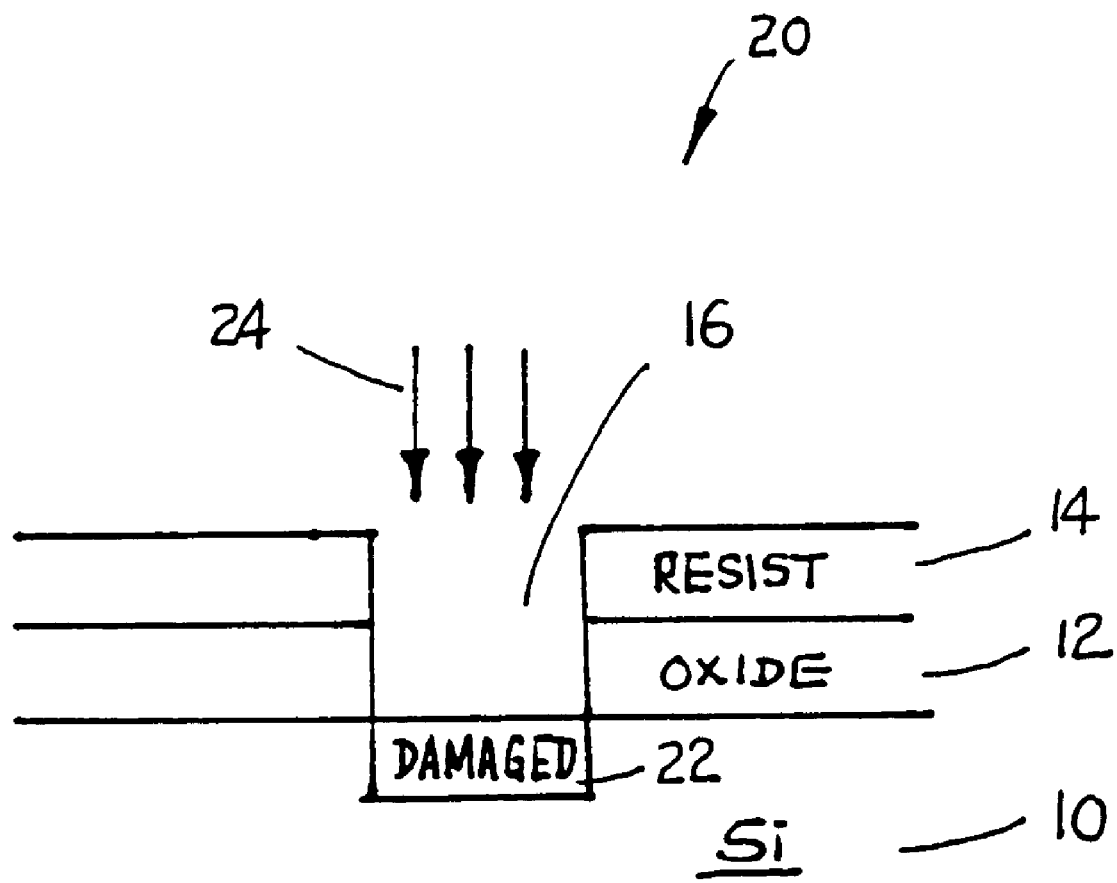
FIG. 1 is an enlarged, cross-sectional view of a conventional silicon substrate having a contact hole and a layer of damaged silicon material formed thereon.

The present invention provides a method for removing simultaneously from a silicon surface polymeric contaminating films and damaged silicon layers by exposing the surface to an amine-containing cleaning solution for a length of time that is sufficient to remove the polymeric films and the damaged silicon layers such that the quality of the IC device built can be ensured.

In the present invention method, the use of a multiple number of cleaning steps and complex cleaning processes such as the combination of a dry ashing process and a wet chemical stripping process can be avoided. The conventional process of wet chemical stripping by a mixture of $H_2SO_4/H_2O_2$ is difficult to control since the high cleaning temperature depletes the concentration of $H_2O_2$ quickly and thus the maintenance of a desirable concentration of the cleaning solution is impossible. Moreover, in modern ULSI devices, the smaller the dimension of the contact holes, the more difficult it is to effectively remove the polymeric films and the damaged silicon layers from the holes. Furthermore, any remaining damaged silicon layers can greatly affect the contact resistance of the hole and therefore renders an IC device defective.

The novel cleaning method provided by the present invention enables the simultaneous cleaning of polymeric films and damaged silicon layers (or amorphized layers) from a amorphized silicon surface by a one-step process. The cleaning solution may include an amine-containing chemical or an ethanolamine-containing chemical. The present invention therefore discloses a simple and effective method to remove etch-induced damaged silicon layers and polymeric films. One of the amine-containing cleaning solution utilized is a mixture of gallic acid-ethanolamine-water. The solution is a safe and aggressive wet formulation for the wet anisotropic etching of damaged silicon layers and etch-induced polymeric films. The gallic acid-ethanolamine-water solution can effectively remove damaged silicon layers and polymeric films without any other post-etch treatment. The normal exposure time for a wafer surface to the cleaning solution is between about 2 and about 20 minutes. For the cleaning of a 0.15 μm diameter and aspect ratio >6 contact hole, the gallic acid-ethanolamine-water post-etch treatment provides the most stable and acceptable contact resistance when compared to the conventional post-etch method (i.e., dry etching/ashing/wet stripping). For instance, the contact resistance of the contact hole after treatment by the gallic acid-ethanolamine-water solution is smaller than 10 kΩ with a standard deviation of less than 5%. contact resistance as low as 6 kΩ can be routinely achieved by using the present invention method. The silicon surface after cleaning has a contact resistance not higher than 12 kΩ. This is a drastic reduction from a pre-treatment value of approximately 20 kΩ. The gallic acid-ethanolamine-water solution is commonly known and commercially available as ACT 690 solution which can be obtained from the Ashland Chemical Company, Alltentown, Pa.

Another suitable cleaning solution for use in the present invention novel method of simultaneously cleaning polymeric films and damaged silicon layers is a product under the name of EKC 265 which primarily contains 2-(2-aminoethoxy) ethanol-hydroxylamine-catechol. The EKC 265 is available from EKC Technology, Inc. in Haywood, Calif.

The present invention novel method of simultaneously cleaning polymeric films and damaged silicon layers from the surface of a silicon wafer can be carried out in the following manner. First, a wet bench process is performed by exposing the surface of a silicon wafer that has contaminating polymeric films and damaged silicon layers on top to a cleaning solution that contains amine or ethanolamine. After a suitable length of time, i.e., between about 2 and about 20 minutes, the wafer is removed from the cleaning solution. The wafer is then soaked in a chemical solvent of NMP for removing the wet bench chemicals. After the NMP soaking process, the wafer can be rinsed by deionized water and then by a solvent of IPA to dry the wafer surface by eliminating water. The wafer surface can optionally be spin-dried. It has been found that both cleaning solutions utilized in the present invention method have a high selectivity for oxide and therefore do not affect the oxide layer on the silicon wafer. The high selectivity ratio of silicon to oxide is greater than 100 which makes it suitable for removing a damaged silicon layer having a thickness between about 20 and about 60 Å in a time period between about 2 and about 20 minutes.

It should be noted that while the present invention novel method of simultaneously cleaning polymeric films and damaged silicon layers from a surface of a silicon wafer has been demonstrated by two desirable cleaning solutions, other cleaning solutions which contain amine or ethanolamine may function equally well in the present invention method. It has been discovered that the amine component can be advantageously used in the effective cleaning of damaged silicon layers from a wafer surface.

The present invention novel method may also be applied to other cleaning applications such as a process of cleaning damaged silicon layers after a nitride etching process for forming a LOCOS field oxide, or a process of removing damaged silicon layers produced in a reactive ion etching process for forming LDD spacers.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for removing simultaneously from a silicon surface polymeric contaminating films and damaged silicon layers comprising the steps of:
   providing a silicon surface having polymeric contaminating films deposited and damaged silicon layers formed thereon, said polymeric contaminating films being formed from a fluorocarbon gas plasma,
   exposing said silicon surface to an ethanolamine-containing cleaning solution for a length of time sufficient to remove said polymeric contaminating films and said damaged silicon layers wherein said damaged silicon layers removed by said cleaning solution have a total thickness between about 20 Å and about 60 Å, and
   rinsing said silicon surface to substantially remove all the cleaning solution and obtaining a silicon surface having contact resistance not higher than 12 kΩ.

2. A method according to claim 1, wherein said polymeric contaminating films comprise carbon and fluorine.

3. A method according to claim 1, wherein said damaged silicon layers comprise amorphized silicon.

4. A method according to claim 1, wherein said damaged silicon layers exhibit a contact resistance of at least 12 kΩ.

5. A method according to claim 1, wherein said cleaning solution comprises ethanolamine and gallic acid.

6. A method according to claim 1, wherein said cleaning solution comprises a water solution of ethanolamine and gallic acid.

7. A method according to claim 1, wherein said silicon surface is exposed to said amine-containing cleaning solution for a length of time between about 2 minutes and about 20 minutes.

8. A method according to claim 1, wherein said silicon surface is rinsed by deionized water.

9. A method for removing unwanted material from a surface of a wafer after a dry etching process comprising the steps of:
   providing an etch tank containing an etch solution comprising ethanolamine and gallic acid,
   exposing said surface of said wafer to said etch solution for a length of time sufficient to remove the at least one unwanted material from said wafer surface, wherein said damaged silicon layers removed by said cleaning solution have a total thickness between about 20 Å and about 60 Å, and
   removing substantially all said etch solution from said wafer surface and obtaining a silicon surface having a contact resistance not higher than 12 kΩ.

10. A method according to claim 9, wherein said at least one unwanted material is selected from the group consisting of polymeric films, damaged silicon layers and other contaminating materials.

11. A method for removing simultaneously from a silicon surface polymeric contaminating films and damaged silicon layers comprising the steps of:
   providing a silicon surface having polymeric contaminating films deposited and damaged silicon layers formed thereon, said polymeric contaminating films being formed from a fluorocarbon gas plasma,
   exposing said silicon surface to an ethanolamine-containing cleaning solution for a length of time of not less than 2 minutes to remove said polymeric contaminating films and said damaged silicon layers wherein said damaged silicon layers removed by said cleaning solution have a total thickness between about 20 Å and about 60 Å, and rinsing said silicon surface to substantially remove all the cleaning solution and obtaining a silicon surface having contact resistance not higher than 12 KΩ.

* * * * *